(12) United States Patent
Park et al.

(10) Patent No.: US 6,897,518 B1
(45) Date of Patent: May 24, 2005

(54) FLASH MEMORY CELL HAVING REDUCED LEAKAGE CURRENT

(75) Inventors: Sheung Hee Park, Pleasanton, CA (US); Richard M. Fastow, Cupertino, CA (US); Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/618,191

(22) Filed: Jul. 10, 2003

(51) Int. Cl.[7] ............................................. H01L 29/788
(52) U.S. Cl. ......................................... 257/315; 257/317
(58) Field of Search ............................. 257/314, 315, 257/317, 324

(56) References Cited

U.S. PATENT DOCUMENTS

| | | | | |
|---|---|---|---|---|
| 6,574,143 B2 | * | 6/2003 | Nakazato | 365/185.18 |
| 6,649,969 B2 | * | 11/2003 | Tsuji et al. | 257/316 |
| 6,768,165 B1 | * | 7/2004 | Eitan | 257/324 |
| 6,772,992 B1 | * | 8/2004 | Lombardo et al. | 257/315 |

* cited by examiner

*Primary Examiner*—David Nelms
*Assistant Examiner*—Quoc Hoang

(57) ABSTRACT

A flash memory cell of the present invention comprises a floating gate, having a charge trapping region and a fin region. A source region and a drain region is formed proximate the floating gate. A control gate is formed above the charge trapping region of the floating gate. The fin region advantageously reduces leakage current, thereby allowing further scaling of the cell.

15 Claims, 5 Drawing Sheets

FLASH MEMORY CELL HAVING REDUCED LEAKAGE CURRENT

FIELD OF THE INVENTION

Embodiments of the present invention relate to flash memory devices, and more particularly to reducing leakage current therein.

BACKGROUND OF THE INVENTION

Referring to FIG. 1A, a floating gate memory cell 105 according to the conventional art is shown. As depicted in FIG. 1A, the cell 105 is fabricated about a semiconductor substrate 110. The cell 105 comprises a source region 115 and a drain region 120. A channel region 125 is disposed between the source 115 and drain 120. A floating gate 130 is formed above the channel region 125. A first isolating layer 135 is disposed between the floating gate 130 and the channel region 125. A control gate 140 is formed above the floating gate 130. A second isolating layer 145 is disposed between the control gate 140 and the floating gate 130.

In a p-channel cell 105, the substrate 110 is p-type semiconductor. The source 115 and drain 120 regions are formed by doping the substrate 110 with an impurity, wherein heavily n-doped semiconductor. The channel region 125 is the portion of the p-type substrate 110 located between the n-type source 1115 and drain 120. The floating gate 130 and the control gate 140 are typically polysilicon layers. The first 135 and second 145 insulating layers are typically a dielectric.

The floating gate 130 provides a charge-trapping region utilized for storing a bit of data. The presence of charge on the floating gate 130 acts to block a high signal (e.g., 5V) present on the control gate 140 such that a conducting channel 125 is not induced between the source 115 and drain 120. When there is no charge stored on the floating gate 130, the high signal (e.g., 5V) present on the control gate 140 induces a conducting channel 125 between the source 115 and drain 120. Hence, the state of a bit is determined by the presence or absence of current flowing between the source 115 and drain 120 as a result of a first signal (e.g., 5V) applied to the control gate 140 and a second signal (e.g., 1V) applied to the drain 115.

Typically, reading a cell 105 entails applying a positive voltage (e.g., 5V) to the control gate 140, and a positive voltage (e.g., 1V) to the drain region 120. The source region 115 and substrate 110 are grounded. If a large current flows from the drain 120 to the source 115 across the channel region 125, the state of the cell represents a "1" bit. If substantially no current flows from the drain 120 to the source 115, the state of the cell represents a '0' bit.

Erasing the memory cell 105, in one configuration, entails applying a positive voltage (e.g., 5V) to the source region 115, a negative voltage (e.g., −10V) to the control gate 140, and tri-stating (e.g., high impedance) the drain region 120. The large potential difference between the control gate (−10V) 140 and the source (5V) 115 causes electrons trapped on the floating gate 130 to be repelled by the control gate 140 and attracted by the source 115. The electrons tunnel from the control gate 130 through the first insulating layer 135 to the source 115.

In another configuration, erasing the memory cell 105 entails applying a large positive voltage (e.g., 10V) to the source region 115, grounding the control gate 140, and tri-stating (e.g., high impedance) the drain region 120. The large potential difference between the control gate (10V) 140 and the source (10V) 115 causes electrons trapped on the floating gate 130 to be attracted by the source 115. The electrons tunnel from the control gate 130 through the first insulating layer 135 to the source 115.

Programming the cell 105 entails applying a positive voltage (e.g., 8.5V) to the control gate 140, a positive voltage (e.g., 5V) to the drain 120, while grounding the source 115 and substrate 110. The potential difference between drain 120 and source 115, causes electrons to flow across the channel from the source (0V) 115 toward the drain (5V) 120. The high voltage applied to the control gate 140 causes some electrons to overcome the potential barrier of the first insulating layer 135. Thus, electrons are injected into the floating gate 130.

Referring now to FIG. 1B, another floating gate memory cell 155 according to the conventional art is shown. In the depicted n-channel cell 155, the substrate 160 is n-type semiconductor, the source 165 and drain 170 regions are formed by doping the substrate 160 with an impurity, wherein heavily p-doped semiconductor is formed. The channel region 175 is the portion of the n-type substrate 160 located between the p-type source 165 and drain 170. The floating gate 180 and the control gate 190 are typically polysilicon layers. The first 185 and second 195 insulating layers are typically a dielectric.

Typically, reading a cell 155 entails applying a low voltage (e.g., 5V) to the control gate 190, and a small voltage (e.g., 1V) to the source region 165, while grounding the drain region 170. If current flows from the source 165 to the drain 170 across the channel region 175, the state of the cell represents a '0' bit. If substantially no current flows from the source 165 to the drain 170, the state of the cell represents a '1' bit.

Erasing the memory cell 155 entails applying a negative voltage (e.g., −20V) to the control gate 190, grounding (e.g., 0V) the source region 165, and tri-stating (e.g., high impedance) the drain region 170. The large potential difference between the control gate (−20V) 190 and the source (0V) 165, causes electrons trapped on the floating gate 180 to be attracted by the source gate 165. Thus, electrons tunnel through the potential barrier of the first insulating layer 185 and are collected by the source 165.

Programming the cell 155 entails grounding (e.g., 0V) the control gate 190, applying a negative voltage (e.g., −20V) to the source 165, while tri-stating (e.g., high impedance) the drain 170. The large potential difference between control gate (0V) 190 and source (−20V) 165, causes electrons to be attracted by the control gate 190. Thus, electrons tunnel through the potential barrier of the first insulating layer 185 and are trapped by the floating gate 180.

Referring now to FIG. 2, a flash memory array 205 according to the conventional art is shown. As depicted in FIG. 2, the memory array 205 comprises a plurality of floating gate memory cells 210 arranged in columns and rows. Each cell 210 comprises a floating gate, a control gate, a drain, and a source.

For p-channel cells 210, the control gate of each cell 210 in a row is coupled to one of N corresponding wordlines ($W_1, W_2, W_3, \ldots W_N$). The drain of each cell 210 in a column is coupled to one of M bitlines ($B_1, B_2, B_3, \ldots B_M$). The source of each cell 210 is typically coupled in common with each other. Alternatively, the sources are coupled in common with each other for block, sectors, or other subdivisions of the entire array. In yet another configurations, the source of each cell in a column is coupled to one of M sub-bitlines.

For an n-channel cells 210, the control gate of each cell 210 in a row is coupled to one of N corresponding wordlines ($W_1, W_2, W_3, \ldots W_N$). The source of each cell 210 in a column is coupled to one of M bitlines ($B_1, B_2, B_3, \ldots B_M$). The drain of each cell 210 is typically coupled in common with each other.

During programming of a p-channel cell connected to a particular bitline (e.g., $B_2$), a positive voltage is also applied to the drain of each non-selected cell attached to the same bitline (e.g., $B_2$). The non-selected cell does not have an induced n-channel between the source and drain, because the gate is grounded by the respective non-selected wordline (e.g., $W_1$). However, despite the lack of an induced n-channel, a leakage current will flow from the source to the drain. For channel lengths of 2 micrometers or less, the leakage current is known to increase by 2–3 orders of magnitude for each 0.1 micrometer decrease in channel length for a given drain to source voltage (VDS).

The increased leakage current from each non-selected cell connected to the particular wordline is problematic. A typically bit line will have N (e.g., 512 or more) cells connected to it. Therefore, the total current on the bit line will be:

$$I_T = I_P + (N-1) \cdot I_L$$

Where $I_T$ is the total current, $I_P$ is the current to be supplied to the cell being programmed, N−1 is the number of non-selected cells attached to the bitline, and $I_L$ is the leakage current in each non-programmed cell. The increased total current flowing on a bitline will result in a potential drop in the bitline programming voltage, due to the finite resistance of typical bitlines. Furthermore, as the total current increases due to increased leakage current of non-selected cells, the power supply circuit on the flash memory device must be increased (e.g., occupy more area on the chip) or an additional off chip supply must be provided.

Hence, short channel floating gates suffer increasing leakage current as the device is scaled. As a result, flash memory devices suffer from increasing voltage drop on the bitlines, and the need for a larger power supply or an extra off chip power supply.

SUMMARY OF THE INVENTION

An improved flash memory device is disclosed. In one embodiment, the flash memory comprises an array of floating gate transistors arranged in rows and columns. Each floating gate transistor comprises a substrate having a source region, drain region, and a channel region disposed between the source and drain regions. A floating gate, comprising a charge trapping region and a fin region is disposed above the source and channel regions. A first isolation layer is disposed between the floating gate and the source, drain and channel regions. A control gate is disposed above the charge trapping region of the floating gate. A second isolation layer is disposed between floating gate and control gate. The fin region advantageously reduces leakage current, thereby allowing further scaling of the cell.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1A:
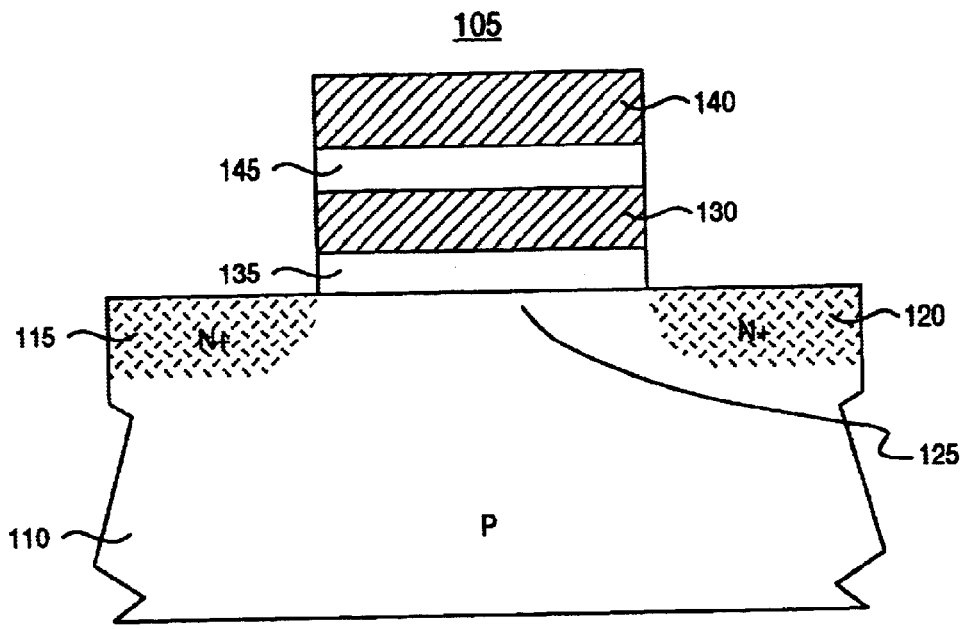
FIG. 1A shows a floating gate memory cell according to the conventional art.
Figure 1B:
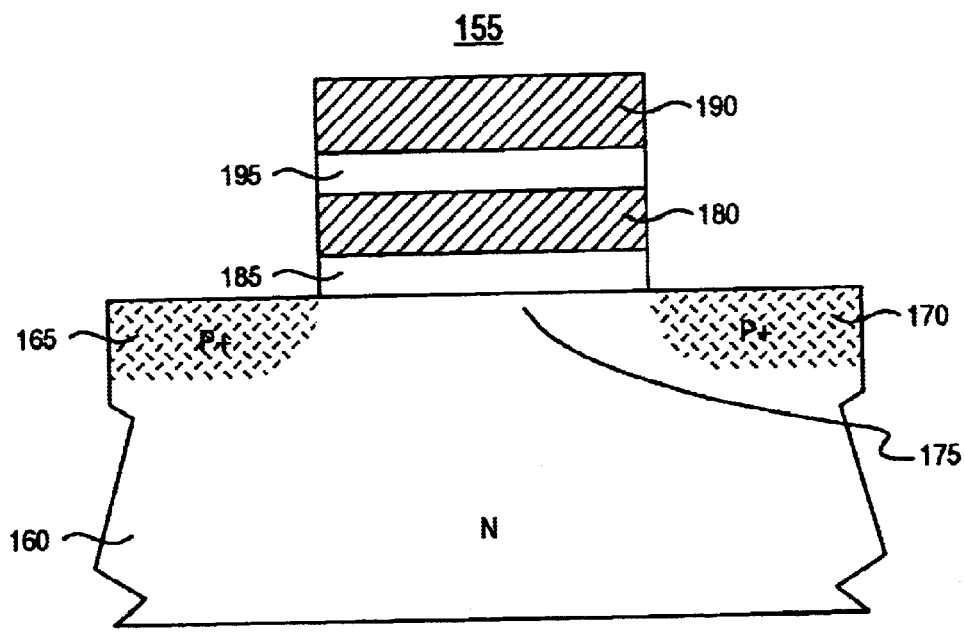
FIG. 1B shows another floating gate memory cell according to the conventional art.
Figure 2:
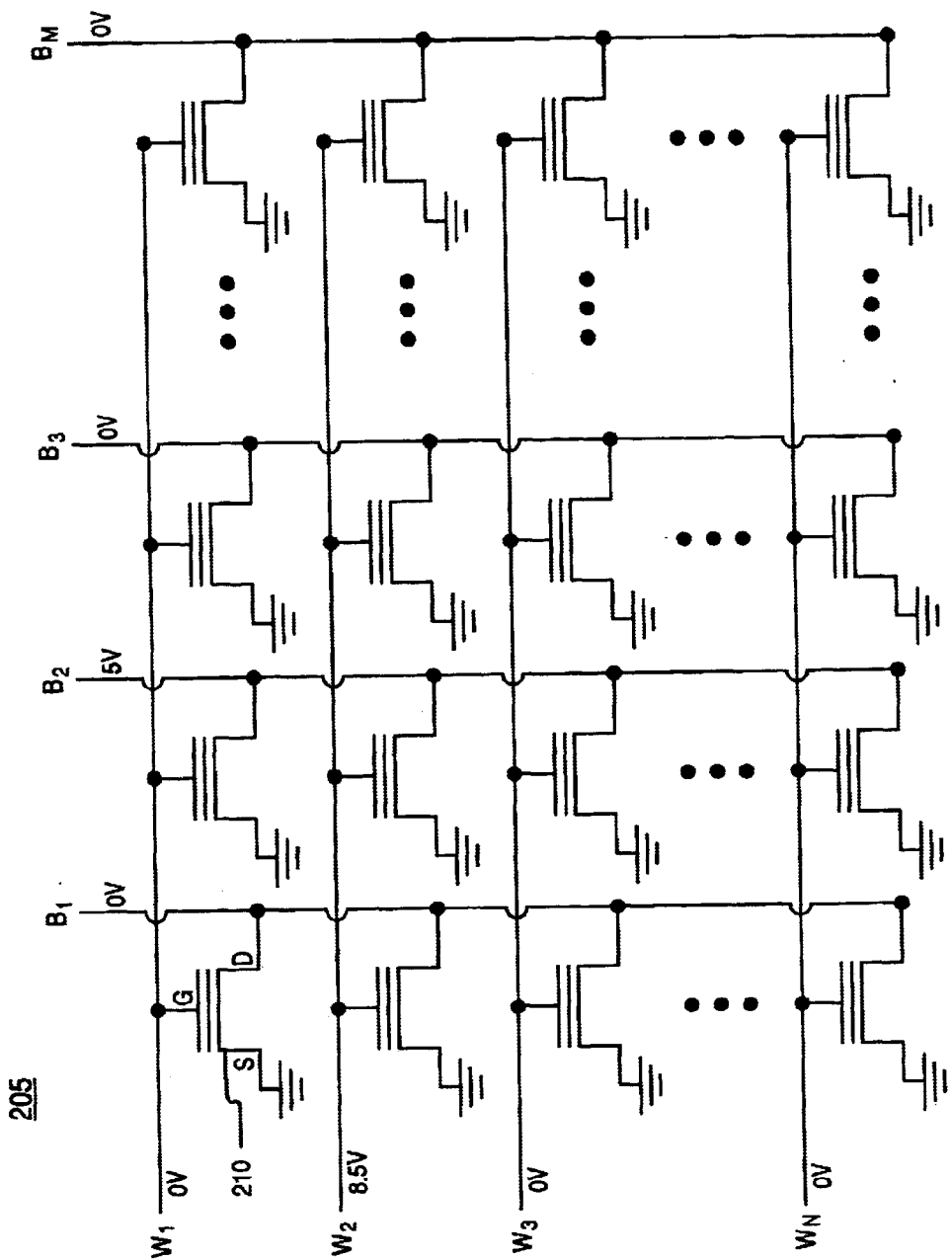
FIG. 2 shows a flash memory array according to the conventional art.
Figure 3:
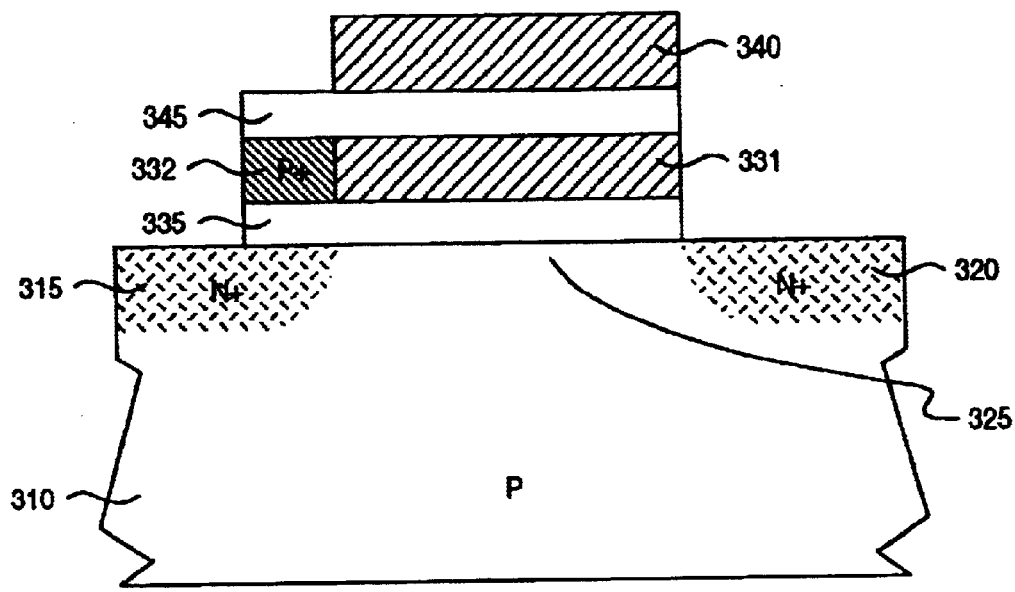
FIG. 3 shows a p-channel floating gate memory cell having a fin region, in accordance with one embodiment of the present invention.

Referring now to FIG. 3, a floating gate memory cell 305 in accordance with one embodiment of the present invention is shown. As depicted in FIG. 3, the cell 305 comprises a source region 315, a drain region 320, and a channel region 325 disposed between the source 315 and drain 320. A floating gate 331, 332 having a charge trapping region 331 formed above the channel region 325, and a fin region 332 overlapping the source region 315. A first isolating layer 335 is disposed between the floating gate 331, 332 and the channel region 325, source region 315, and drain region 320. A control gate 340 is formed above the charge trapping region 331. A second isolating layer 345 is disposed between the control gate 340 and the floating gate 331, 332.

In one implementation of the present embodiment, the substrate 310, including the channel region 325, is p-doped (P) semiconductor. The source region 315 and drain region 320 are formed by doping the substrate 310 with an impurity, such that heavily n-doped (N+) semiconductor is formed in the substrate 310. The fin region 332 is heavily p-doped (P+) semiconductor. The charge trapping region 331 may be intrinsic or compensated semiconductor. The control gate 140 may be heavily n-doped semiconductor. The first and second isolating layers 335, 345 are comprised of dielectric material.

During programming, when the cell 305 is a non-selected cell attached to a bitline of another cell to be programmed, the drain 320 receives a first voltage (e.g., 1V), the control gate 140 a second voltage (e.g., 0V), while the source 115 and substrate 110 are grounded. In short channel length (e.g., 3 micrometer or less) cells 305, the potential applied to the drain 320 lowers the barrier voltage of the source-substrate junction depletion region, near the surface of the channel region 325. Majority carrier electrons in the source 315 therefore more readily overcome the depletion region barrier voltage, which result in leakage current. The increased leakage current, resulting from the reduced barrier voltage in short channel devices, is commonly referred to as drain induced barrier lowering (DIBL) current.

The heavily p-doped fin 332 acts to increase the barrier voltage proximate the channel region 325. The increased barrier voltage along the surface of the channel region 325 results in a decrease in leakage current. The decrease in leakage current, as a result of the fin region 332, can be utilized to offset DIBL in short channel devices. Thus, allowing for further scaling of floating gate memory cells 305.

Figure 4:
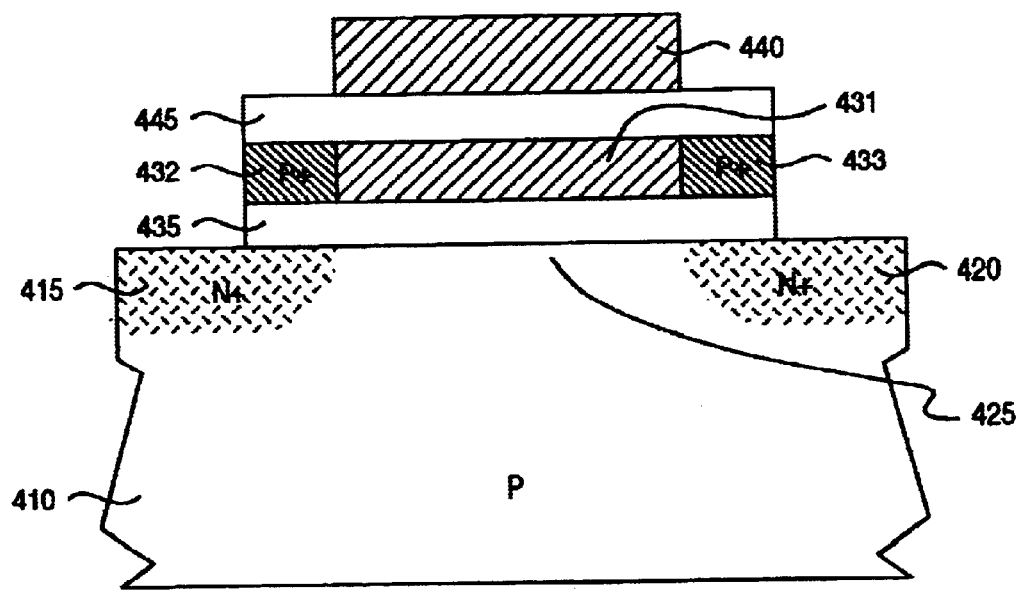
FIG. 4 shows a p-channel floating gate memory cell having a plurality of fin regions, in accordance with one embodiment of the present invention.

Referring now to FIG. 4, a floating gate memory cell 405 in accordance with one embodiment of the present invention is shown. As depicted in FIG. 4, the cell 405 comprises a source region 415, a drain region 420, and a channel region 425 disposed between the source 415 and drain 420. A floating gate 431, 432, 433 having a charge trapping region 431 formed above the channel region 425, a first fin region 432 overlapping the source 415, and a second fin region 433 overlapping the drain region 420. A first isolating layer 435 is disposed between the floating gate 431, 432, 433 and the channel region 425, source region 415, and drain region 420. A control gate 440 is formed above the charge trapping region 431. A second isolation layer 445 is disposed between the control gate 440 and the floating gate 431, 432, 433.

In one implementation of the present embodiment, the substrate 410, including the channel region 425, is p-doped (P) semiconductor. The source region 415 and drain region 420 are formed by doping the substrate 410 with an impurity, such that heavily n-doped (N+) semiconductor is formed. The first and second fin regions 432, 433 are also heavily n-doped (N+) semiconductor. The charge trapping region 431 may be intrinsic or compensated semiconductor. The control gate 440 may be heavily n-doped semiconductor. The first and second isolating layers 435, 445 are comprised of dielectric material.

The fin regions 432, 433 advantageously increase the depletion regions between the source-substrate junction and the drain-substrate junction proximate the channel region 425. Thus, the fin regions 432, 433 reduce the leakage current due to DIBL.

Figure 5:
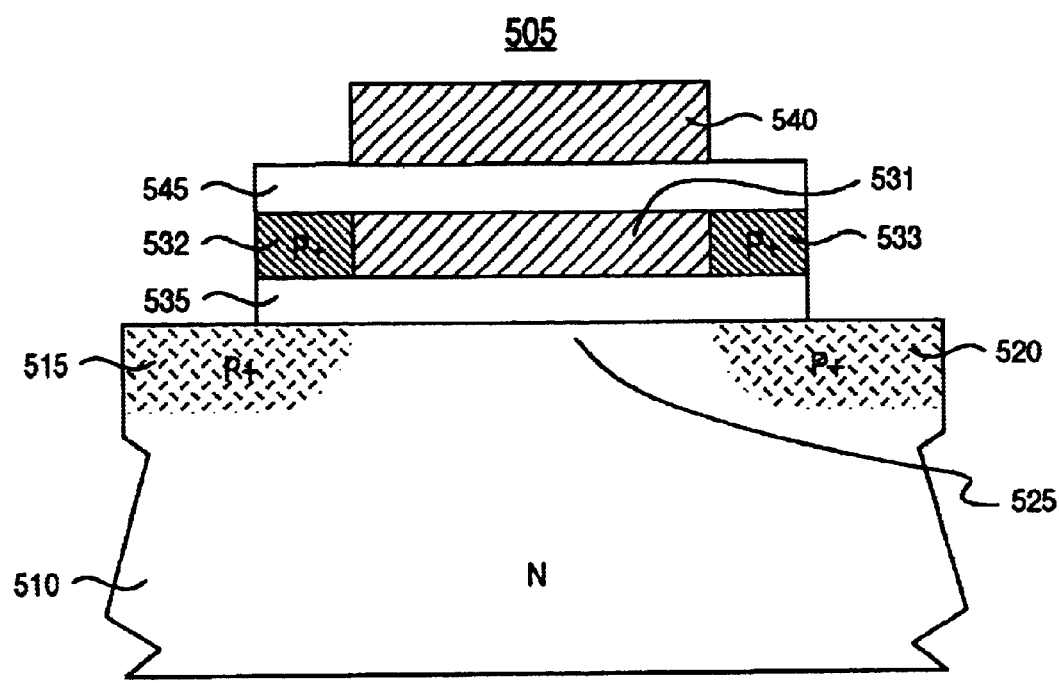
FIG. 5 shows a n-channel floating gate memory cell having a plurality of fin regions, in accordance with one embodiment of the present invention.

Referring now to FIG. 5, a floating gate memory cell 505 in accordance with one embodiment of the present invention is shown. As depicted in FIG. 5, the cell 505 comprises a source region 515, a drain region 520, and a channel region 525 disposed between the source 515 and drain 520. A floating gate 531, 532, comprising a charge trapping region formed above the channel region 525, and first fin region 532 overlapping the source region 515. In another implementation, the floating gate 531, 532, 533 comprises a charge trapping region formed above the channel region 525, a first fin region 532 overlapping the source region 515, and a second fin region 533 overlapping the drain region 520. A first isolating layer 535 is disposed between the floating gate 531, 532, 533 and the channel region 525, source region 515, and drain region 520. A control gate 540 is formed above the charge trapping region 531. A second isolation layer 545 is disposed between the control gate 540 and the floating gate 531, 532, 533.

In one implementation of the present embodiment, the substrate 510, including the channel region 525, is n-doped (N) semiconductor. The source region 515 and drain region 520 are formed by doping the substrate 310 with an impurity, such that a heavily p-doped (P+) semiconductor. The first and second fin regions 532, 533 are p-type heavily doped (P+) semiconductor. The charge trapping region 531 may be intrinsic or compensated semiconductor. The control gate 540 may be heavily n-doped semiconductor. The first and second isolating layers 535, 545 are comprised of dielectric material.

The source to drain current in the present embodiment is provided by holes, which comprise the majority carrier. Holes have a lower mobility as compared to electrons. The barrier voltage of the drain-substrate junction causes scattering of holes, thus effectively reducing the mobility of the majority carrier holes. As a result, the read current in a programmed cell is reduced.

The heavily p-doped fin(s) 532, 533 act to reduce the barrier voltage proximate the channel region 535. The reduced barrier voltage proximate the channel region 535, as a result of the fin(s) 532, 533, thus advantageously increases the effective mobility. Increasing the effective mobility increases the source to drain current, and thus the read margin between the programmed state of the cell and the non-programmed state.

Figure 6:
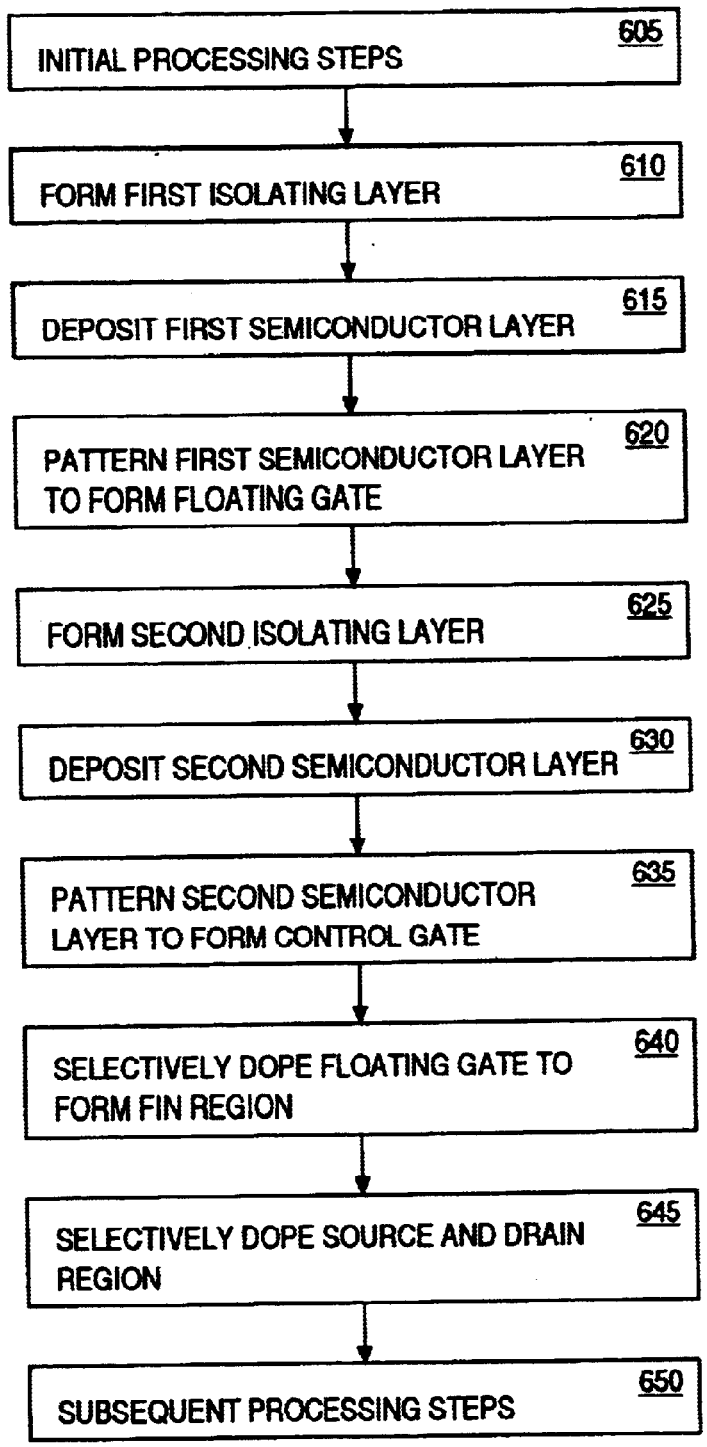
FIG. 6 shows a flow diagram of a method of manufacturing a floating gate memory cell in accordance with one embodiment of the present invention.

Referring now to FIG. 6, a flow diagram of a method of manufacturing a floating gate memory cell in accordance with one embodiment of the present invention is shown. As depicted in FIG. 6, the process begins with various initial steps performed on a wafer, at step 605. The initial steps may include processes such as cleaning, etching, deposition, implanting, diffusion, and the like.

Next at step 610, the present embodiment forms a first isolation layer on the substrate. In one implementation, the first isolation layer can be formed by any well-known oxidation, deposition, or the like process. In an exemplary oxidation process, the wafer is exposed to an oxidizing agent in a furnace, providing a dry or steam ambient at a temperature of approximately 700–1200° centigrade, for a approximately 1–60 minutes. In one implementation of the present embodiment, the substrate material of the wafer is silicon (Si), the oxidizing agent is oxygen (O), and the resulting first isolation layer is silicon dioxide ($SiO_2$), having a thickness of approximately 50–200 Å.

Next, at step 615, the present embodiment deposits a first semiconductor layer on the first isolation layer. In one implementation, the first semiconductor layer can be formed by any well-known deposition process, such as chemical vapor deposition (CVD), or the like. The CVD process typically entails reaction of gaseous compounds in a reaction chamber, whereby the desired material comprising the first semiconductor layer is deposited directly from the gas phase onto the surface of the first isolation layer. In an exemplary implementation, saline (SiH4) gas is supplied at approximately 600–650° centigrade for approximately 15–120 seconds in a low pressure reactor. Polysilicon (Si) is thereby conformally deposited on the wafer surface and hydrogen ($2H_2$) is produced as a byproduct. In one implementation of the present embodiment, the first semiconductor layer is polysilicon (Si), approximately 20–200 Å thick.

Next, at step 620, the present embodiment patterns the first semiconductor layer to form a floating gate. In one implementation, the floating gate may be formed by any well-known lithography and selective etching processes. In an exemplary implementation, the resist layer can be formed by applying a few drops of a liquid light-sensitive polymer on a rapidly spinning surface of the wafer, and then allowing the resist to dry. A mask, containing a pattern of transparent and opaque areas corresponding to the desired floating gate region, is placed over the resist. The resist is then exposed to ultraviolet or near-ultraviolet light through the transparent portions of the mask. For a negative resist, the molecules of the resist are polymerized (cross-lined) in areas exposed to the light. For a positive resist, molecular bonds are broken where the resist is illuminated. The unexposed portions of the resist remain unaffected. The unpolymerized areas of the resist are then selectively dissolved in a chemical wash, thereby forming a patterned resist corresponding to the desired floating gate region. The wafer surface is then exposed to a plasma, which is an almost neutral mixture of energetic molecules, ions, and electrons that have been excited by radio frequency or microwave energy. The excited species interact chemically with portions of the first layer, thereby allowing the ions to knock away atoms in the first layer exposed by the patterned resist. The patterned resist is then removed by applying a resist stripper, which causes the resist to swell and lose adhesion to the surface upon which it is applied.

The resulting floating gate structure should have a width substantially equal to the desired channel width, and a length greater than the desired channel length. If a single-fin structure is desired, the length of the floating gate structure should be approximately equal to the channel length plus the width of the source-substrate depletion region. If a two-fin structure is desired, the length of the floating gate structure should be approximately equal to the channel length plus the desired source-substrate and drain-substrate depletion regions.

Next at step 625, the present embodiment forms a second isolation layer on the wafer. In one implementation, the second isolation layer can be formed by any well-known oxidation, deposition, or the like process. In an exemplary deposition process, the wafer is exposed to a tetraethylorthosilicate ($Si(OC_2H_5)_4$) gas in a chemical vapor deposition (CVD) system. The tetraethylorthosilicate decomposes to form a silicon dioxide ($SiO_2$) layer having a thickness of approximately 50–200 Å.

Next, at step 630, the present embodiment deposits a second semiconductor layer on the second isolation layer. In one implementation, the second semiconductor layer can be formed by any well-known deposition process, such as chemical vapor deposition (CVD), or the like. The polysilicon can be doped by introducing a desired impurity in the chemical vapor deposition chamber. Alternatively, the polysilicon can be doped by diffusion or implantation. In one implementation of the present embodiment, the second semiconductor layer is polysilicon (Si), approximately 400–3000 Å thick.

Next, at step 635, the present embodiment patterns the second semiconductor layer to form a control gate. In one implementation, the control gate may be formed by any well-known lithography and selective etching processes. The resulting control gate structure should have a width and length substantially equal to the desired channel width and length.

Next, at step 640, the present embodiment selectively dopes the fin region(s) of the floating gate. The doping can be performed by any well-known diffusion, implant, or like process. In one implementation of the present embodiment, the mask utilized for forming the control gate in step 635 may be utilized as a doping mask. An impurity is then introduced into the exposed portions of the one or two fins of the floating gate utilizing a high-voltage particle accelerator. The acceptor impurity may be boron, or the like, having an implanted concentration of approximately $10^{17}$–$10^{19}$ atoms per cubic centimeter.

Optionally, the doping performed at step 640 may also be utilized to selectively dope the source and drain region. When combined with a the source and drain region doping provided by the following step 645 a lightly doped structure, providing enhanced breakdown voltage protection, is formed. To form such a lightly doped structure, the concentration of implanted impurity, in the source and drain regions, provided by step 645 should be greater than the implanted impurity concentration provided by step 640.

Next, at step 645, the present embodiment selectively dopes the desired source and drain regions. The doping can be performed by any well-known diffusion, implant, or the like process. In one implementation of the present embodiment, the source and drain regions are defined by a patterned resist layer. An n-type impurity is then introduced into the exposed portions of the substrate, wherein the source and drain regions are to be formed, utilizing a high-voltage particle accelerator. In a p-channel implementation, the donor impurity may be phosphorus, arsenic, or the like, having an implanted concentration of approximately $10^{17}$–$10^{19}$ atoms per cubic centimeter. In an n-channel implementation, the acceptor impurity may be boron, or the like, having an implanted concentration of approximately $10^{17}$–$10^{19}$ atoms per cubic centimeter.

Finally, at step 650, fabrication proceeds with various subsequent processing steps. The subsequent steps may include processes such as deposition, etching, annealing, cleaning, polishing, metalization, passivation, and/or the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A flash memory cell comprising:
   a substrate having a source region, a drain region, and a channel region coupled between said source region and said drain region;
   a floating gate, having a charge trapping region and a first fin region, wherein said charge trapping region is coupled to said channel region and said first fin region is coupled to said source region, wherein said first fin region comprises a doped region to reduce leakage current; and
   a control gate coupled to said charge trapping region.

2. The flash memory cell according to claim 1, wherein said first fin region reduces drain to source leakage current.

3. The flash memory cell according to claim 1, wherein said first fin region increases drain to source read current.

4. The flash memory cell according to claim 1, wherein said first fin region reduces drain induced barrier reduction.

5. The flash memory cell according to claim 1, wherein said first fin region reduces barrier scattering.

6. The flash memory cell according to claim 1, wherein said floating gate further comprises a second fin region, wherein said second fin region is coupled to said drain region.

7. The flash memory cell according to claim 6, wherein said second fin region reduces drain to source leakage current.

8. The flash memory cell according to claim 6, wherein said second fin region increases drain to source read current.

9. A floating gate transistor comprising:
- a source;
- a drain;
- a channel disposed between said source and said drain;
- a charge trapping region disposed above said channel region;
- a first fin disposed adjacent said charge trapping region and above said source, wherein said first fin comprises a doped region to reduce leakage current;
- a first isolation layer disposed above said channel and said source and below said charge trapping region and said first fin;
- a control gate disposed above said charge trapping region; and
- a second isolation layer disposed above said charge trapping region and said first fin and below said control gate.

10. The floating gate transistor according to claim 9, wherein said first fin comprises p-doped semiconductor.

11. The floating gate transistor according to claim 9, further comprising:
- a second fin disposed adjacent said charge trapping region and above said drain; and said first isolation layer further disposed above said drain and below said second fin.

12. The floating gate transistor according to claim 11, wherein said second fin comprises p-doped semiconductor.

13. The floating gate transistor according to claim 9, wherein:
- said source comprises n-doped semiconductor;
- said drain comprises n-doped semiconductor; and
- said channel comprises p-doped semiconductor.

14. The floating gate transistor according to claim 9, wherein:
- said source comprises p-doped semiconductor;
- said drain comprises p-doped semiconductor; and
- said channel comprises n-doped semiconductor.

15. The floating gate transistor according to claim 9, wherein:
- said first isolation layer comprises a dielectric; and said second isolation layer comprises a dielectric.

* * * * *